United States Patent
Chuang (10) Patent No.: US 8,767,840 B2
(45) Date of Patent: Jul. 1, 2014

(54) METHOD FOR DETECTING ERRORS AND RECOVERING VIDEO DATA

(75) Inventor: Ye Lin Chuang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 817 days.

(21) Appl. No.: 12/617,498

(22) Filed: Nov. 12, 2009

(65) Prior Publication Data
US 2010/0205498 A1 Aug. 12, 2010

Related U.S. Application Data

(60) Provisional application No. 61/151,747, filed on Feb. 11, 2009.

(51) Int. Cl.
 *H04N 7/12* (2006.01)
 *H03M 13/09* (2006.01)
 *H04N 7/68* (2006.01)

(52) U.S. Cl.
 CPC ............... *H03M 13/09* (2013.01); *H04N 19/00939* (2013.01)
 USPC .................................. 375/240.27

(58) Field of Classification Search
 CPC ............ H03M 13/09; H04N 19/00939
 USPC .................................. 375/240.27
 See application file for complete search history.

(56) References Cited

U.S. PATENT DOCUMENTS

| | | | | |
|---|---|---|---|---|
| 5,202,979 A | * | 4/1993 | Hillis et al. | 714/6.12 |
| 5,757,824 A | * | 5/1998 | Arai et al. | 714/755 |
| 7,372,859 B2 | * | 5/2008 | Hall et al. | 370/400 |
| 2006/0013318 A1 | | 1/2006 | Webb et al. | |
| 2006/0056705 A1 | | 3/2006 | Kadono et al. | |
| 2006/0146734 A1 | * | 7/2006 | Wenger et al. | 370/260 |
| 2006/0209950 A1 | | 9/2006 | Zhu | |
| 2006/0222014 A1 | | 10/2006 | Zhang | |
| 2009/0177949 A1 | * | 7/2009 | Lamy-Bergot et al. | 714/784 |

FOREIGN PATENT DOCUMENTS

| | | |
|---|---|---|
| CN | 1780397 A | 5/2006 |
| CN | 1893663 A | 1/2007 |
| JP | 2007282084 A | 10/2007 |

\* cited by examiner

*Primary Examiner* — Richard Torrente
(74) *Attorney, Agent, or Firm* — Slater and Matsil, L.L.P.

(57) ABSTRACT

A method of processing video data includes providing a bit-stream; and decoding the bit-stream. The step of decoding the bit-stream includes extracting a data portion from the bit-stream; extracting a first backup copy of the data portion from the bit-stream; and determining correct values of syntaxes in the data portion from the data portion itself and the first backup copy of the data portion. A second backup copy of the data portion may be extracted from the bit-stream and cross-examined with the data portion and the first backup copy of the data portion.

15 Claims, 13 Drawing Sheets

| NALU_PPS | NALU_Slice | NALU_PPS | NALU_Slice |

Fig. 10A

| NALU_PPS | NALU_Slice | NALU_Slice | NALU_Slice |

Fig. 12

METHOD FOR DETECTING ERRORS AND RECOVERING VIDEO DATA

This application claims the benefit of U.S. Provisional Application No. 61/151,747 filed on Feb. 11, 2009, entitled "Method for Detecting Errors and Recovering Video Data," which application is hereby incorporated herein by reference.

TECHNICAL FIELD

This invention relates generally to video data coding and encoding methods, and more particularly to methods for detecting and correcting errors in the video data.

BACKGROUND

Video communications systems are continually being enhanced to meet requirements such as reduced cost, reduced size, improved quality of service, and increased data rate. The ITU-T Video Coding Experts Group (VCEG) and the ISO/IEC Moving Picture Experts Group (MPEG) have defined video coding standards known as ITU-T Recommendation H.264 and ISO/IEC MPEG-4 advanced video coding (H.264). The H.264 standards include functions such as spatial prediction, temporal prediction, transformation, interlaced coding, and loss-proof entropy coding.

Although many advanced processing techniques are available, the design of H.264 compliant video encoders and methods for encoding and decoding are not specified in the standards. Therefore, the optimization of the communication systems is left to the design of the video encoders and decoders.

In the data transmission using H.264 standards, data are transmitted in the form of bit-streams. The existing H.264 format lacks the mechanism for detecting errors and correcting the bit-streams from errors. For example, each H.264 bit-stream includes a header named as seq_parameter_set (SPS), which stores important parameters of the bit-stream. If an error occurs to the SPS, the entire bit-stream, which may include hundreds of image frames, may not be decoded correctly. In addition, other parameters such as pic_parameter_set (PPS) and macro block (MB) data all affect the decoding of images, although may be in different scales. However, due to the bit-stream format, if any error occurs, for example, a bit is lost or a bit is wrongfully inserted, the decoding of the entire bit-stream may fail. The decoder may have to wait for the next SPS or PPS before it can decode again. On the other hand, an error in the MB may be propagated to the remaining MBs in the same frame. What is needed, therefore, is an error detection and correction mechanism for overcoming the above-described shortcomings in the prior art.

SUMMARY OF THE INVENTION

In accordance with an embodiment of the present invention, a method of processing video data includes providing a bit-stream; and decoding the bit-stream. The step of decoding the bit-stream includes extracting a data portion from the bit-stream; extracting a first backup copy of the data portion from the bit-stream; and determining correct values of syntaxes in the data portion from the data portion and the first backup copy of the data portion. A second backup copy of the data portion may be extracted from the bit-stream and cross-examined with the data portion and the first backup copy of the data portion. Other embodiments are also disclosed.

The advantageous features of the present invention include mechanisms for finding and correcting errors in the H.264 bit-streams, and hence improving reliability in H.264 bit-stream transmission.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Novel error detection and correction methods and corresponding formats of bit-streams are presented. The variations and operation of the embodiments are discussed. Throughout the various views and illustrative embodiments of the present invention, like reference numbers are used to designate like elements. Although the decoding of the formats of bit-streams is discussed in detail, the encoding of the bit-stream is also in the scope of the embodiments of the present invention.

Figure 1:
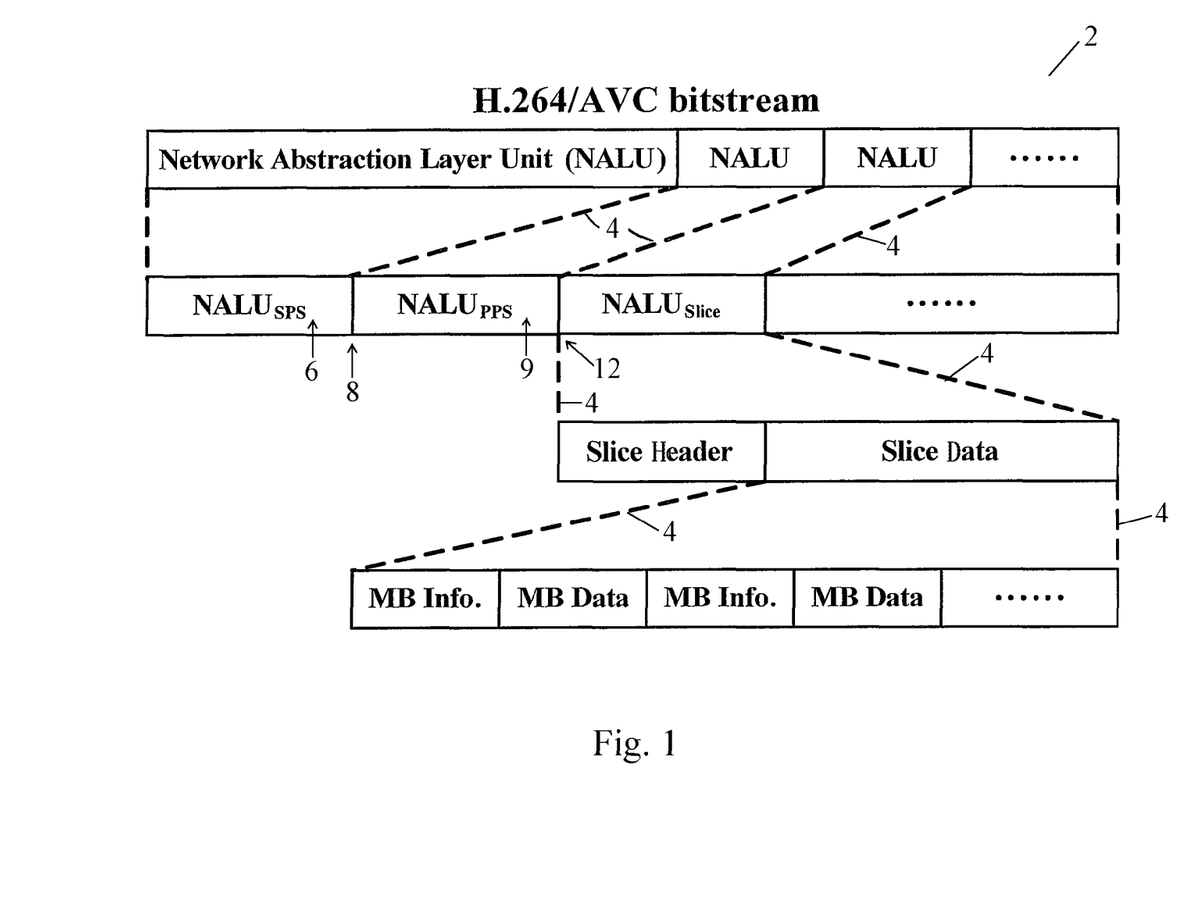
FIG. 1 illustrates an H.264 bit-stream and positions for inserting backup data.

FIG. 1 illustrates bit-stream 2, which may be an H.264 bit-stream. Bit-stream 2 includes a plurality of network abstraction layer units (NALUs), which are data packages. The NALUs including seq_parameter_set (SPS), pic_parameter_set (PPS), and slice data are different types of NALUs, and are indicated as $NALU_{SPS}$ (or alternatively SPS), $NALU_{PPS}$ (or alternatively PPS), and $NALU_{Slice}$ (or alternatively Slice), respectively. The NALUs having different formats are represented by different NALU_type_ids. For example, $NALU_{SPS}$ has the NALU_type_id of 7, while $NALU_{PPS}$ has the NALU_type_id of 8. The SPS may include syntaxes such as profile_idc, constraint_set0_flag, constraint_set1_flag, seq_parameter_set_id, and the like. The PPS may include syntaxes such as pic_parameter_set_id seq_parameter_set_id, entropy_coding_mode_flag, pic_order_present_flag, and the like. Throughout the description, dotted lines (for example, dotted lines 4) are used to show either the specific embodiments or details of an NALU (or a portion of the data), wherein the blocks connected to the top ends of lines 4 correspond to the NALUs or the data, while the blocks connected to the bottom ends of lines 4 correspond to the specific embodiments or details.

A bit-stream may include an $NALU_{SPS}$, one or more $NALU_{PPS}$, and multiple $NALU_{Slice}$, as shown in FIG. 1. The $NALU_{Slice}$ may include multiple slice data including macro block (MB) information (MB_info) and MB_data. It is noted that the H.264 bit-streams may have multiple variations of formats. Although only some of the variations are discussed, one skilled in the art may apply the concept of the embodiments to other variations.

In the conventional H.264 bit-stream format, none of the $NALU_{SPS}$, $NALU_{PPS}$, and $NALU_{Slice}$ have any backup copy. Therefore, if these data are corrupted, there is no adequate data recovery mechanism. The embodiments of the present invention provide backup data for restoring the corrupted data. FIG. 1 illustrates exemplary positions 6, 8, 9, and 12, at which the backup data may be inserted. However, other inserting positions are also in the scope of the embodiments of the present invention. The details of the backup data are discussed in detail in the following paragraphs.

Figure 2A:
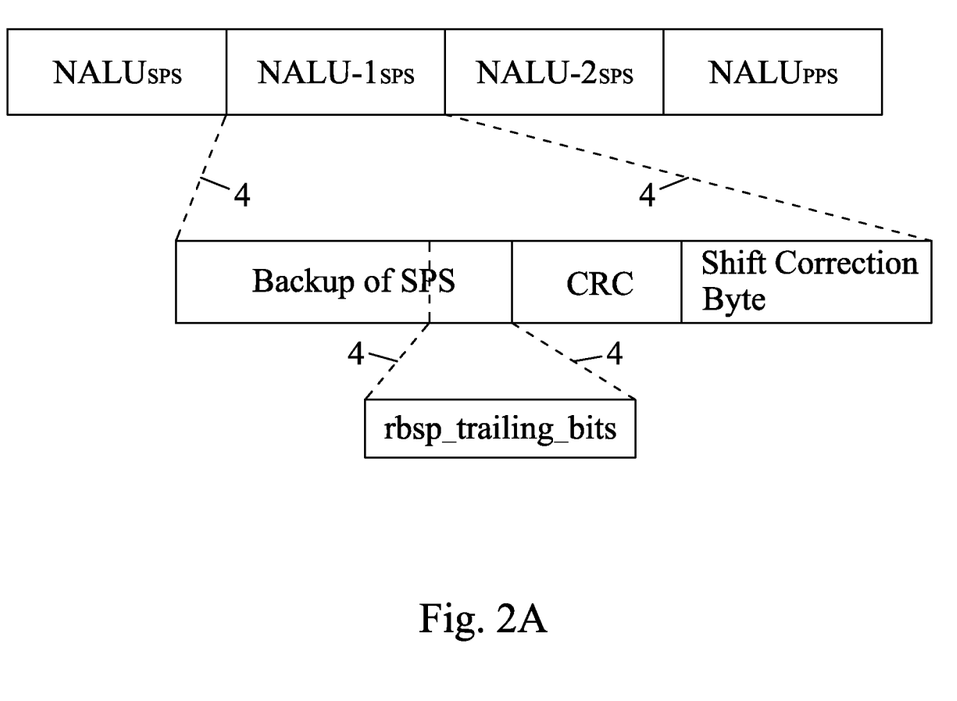
FIG. 2A illustrates backup network abstraction layer units (NALU) comprising backup copies of seq_parameter_set (SPS) inserted after the original NALU for the SPS.

FIG. 2A illustrates an exemplary embodiment for encoding the bit-streams and backing up SPS. A portion of a bit-stream is illustrated, which portion includes $NALU_{SPS}$, which is the original $NALU_{SPS}$ having a SPS. Two backup NALUs, namely NALU-1$_{SPS}$ and NALU-2$_{SPS}$, are placed behind the original $NALU_{SPS}$. Each of the NALU-1$_{SPS}$ and NALU-2$_{SPS}$ includes a backup copy of the SPS, a circular redundancy check (CRC) data, and a shift correction byte. The backup copy of the SPS may further include rbs_trailing_bits in order to make the number of bits in the backup copy of the SPS an integer times the bytes. Accordingly, the backup copy of the SPS becomes byte aligned, and the CRC and shift correction byte can be correctly retrieved. The CRC is used to verify the correctness of the copy of the SPS. In an exemplary embodiment, the shift correction byte is 1000_0001, although other shift correction bytes may also be used. Therefore, there are three copies of the SPS that can be used for cross-examination to determine the correctness of the $NALU_{SPS}$. In alternative embodiments, there is only one backup NALU, namely NALU-1$_{SPS}$, in addition to the original $NALU_{SPS}$. In yet other embodiments, there are more than two backup $NALU_{SPS}$. It is noted that increasing the number of backup copies of the $NALU_{SPS}$ will increase the accuracy in the correction of errors. However, the cost such as process power and the required number of registers is also increased. The backup copies NALU-1$_{SPS}$ and NALU-2$_{SPS}$ may be inserted into position 8 in FIG. 1, which is between the original $NALU_{SPS}$ and the original $NALU_{PPS}$.

Figure 3A:
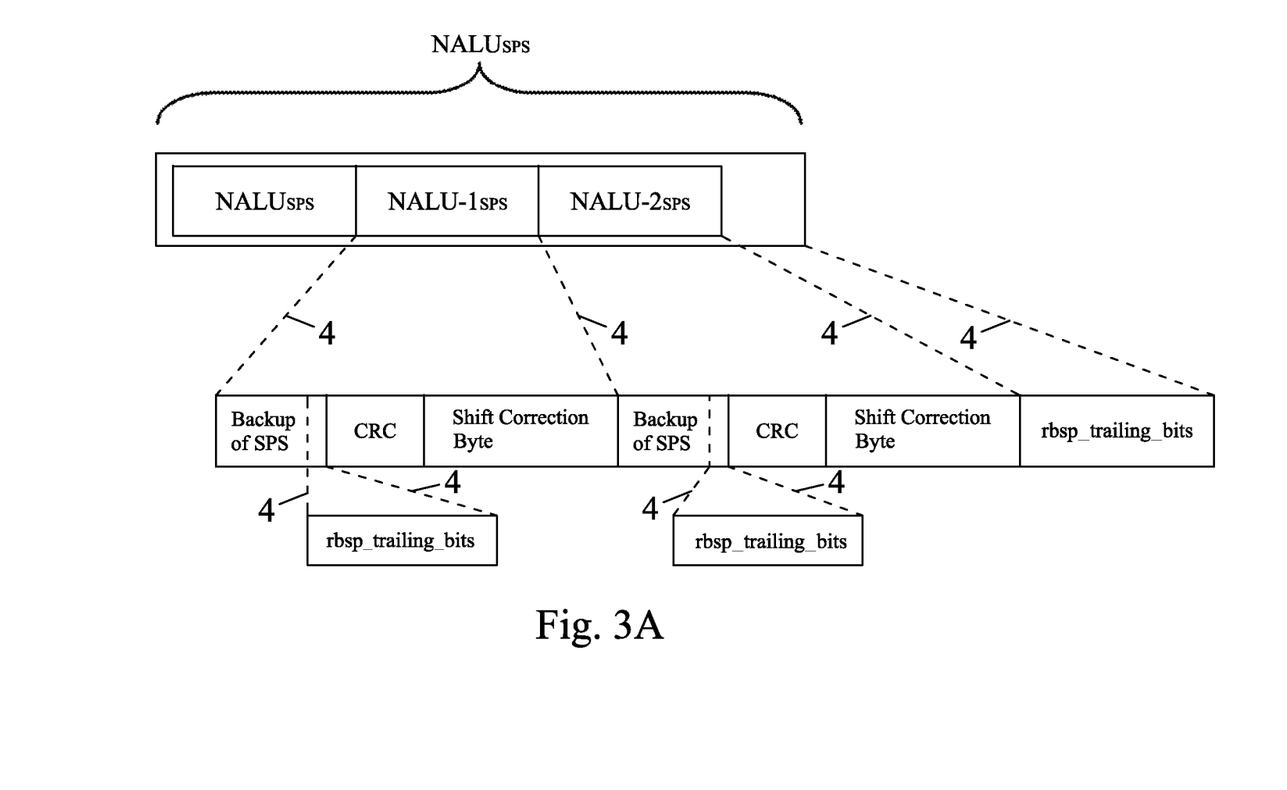
FIG. 3A illustrates backup copies of the SPS inserted inside the original NALU for the SPS.

In alternative embodiments, as shown in FIG. 3A, the backup copies of the SPS may be inserted inside the original $NALU_{SPS}$ (position 6 in FIG. 1). In this embodiment, the backup copies of the SPS may be inserted after the original SPS, and before the rbsp_trailing_bits. Again, each backup copy of the SPS may include additional rbsp_trailing_bits, the corresponding CRC data, and a shift correction byte (1000_0001). The additional rbsp_trailing_bits achieve the byte alignment for the following CRC and shift correction bytes, so that they can be correctly retrieved. In the parsing and decoding of the NALU, the trailing bits will be removed to retrieve the backup copy of the SPS.

Please note that the original $NALU_{SPS}$ does not have the CRC data. However, it will have rbsp_trailing_bits (not shown). Therefore, the CRC data and the shift correction byte are newly added information. It is realized that the format of NALU-1$_{SPS}$ and NALU-2$_{SPS}$ as shown in FIG. 2A and the modified $NALU_{SPS}$ as shown in FIG. 3A are different from the existing $NALU_{SPS}$ format, and hence the corresponding NALU_type_id of NALU-1$_{SPS}$ (and NALU-2$_{SPS}$) may use the reserved NALU_type_id (from 24 to 31), instead of using the existing NALU_type_id 6, which will still be used by the $NALU_{SPS}$. Both NALU-1$_{SPS}$ and NALU-2$_{SPS}$ have the same newly used NALU_type_id. Therefore, when the decoder finds two identical NALUs having the new NALU_type_id representing the backups of $NALU_{SPS}$, the decoder knows that there are two backup copies.

Figure 2B:
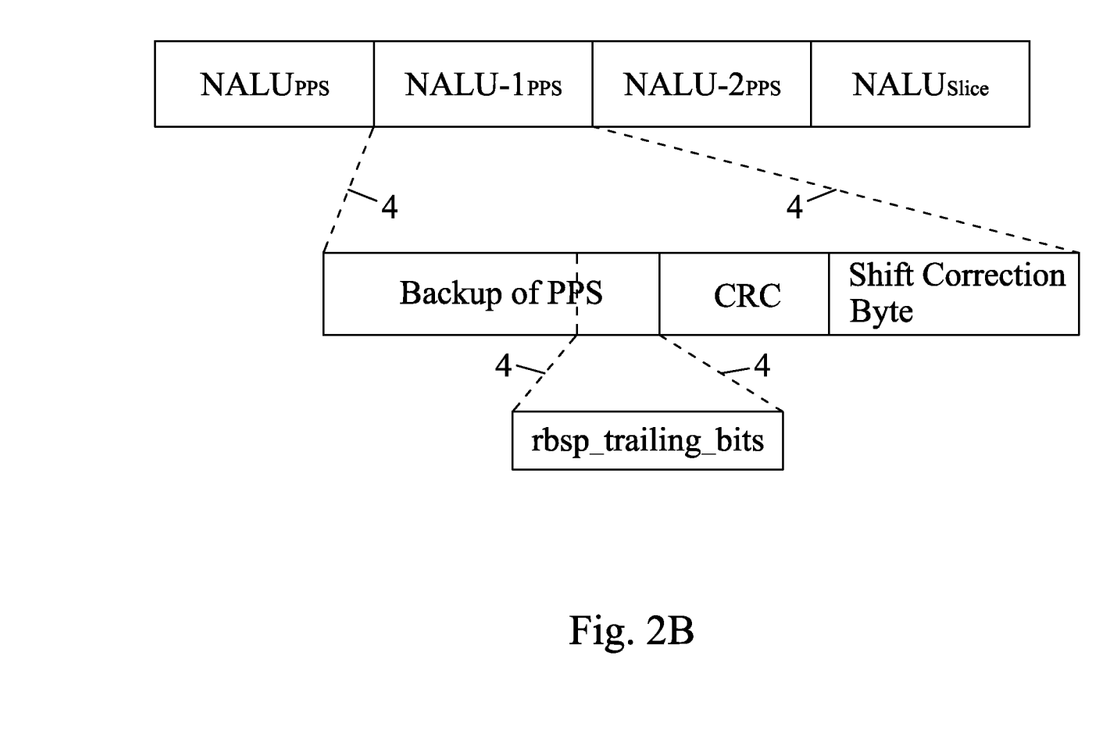
FIG. 2B illustrates backup NALUs comprising backup copies of pic_parameter_set (PPS) inserted after the original NALU for the PPS.
Figure 3B:
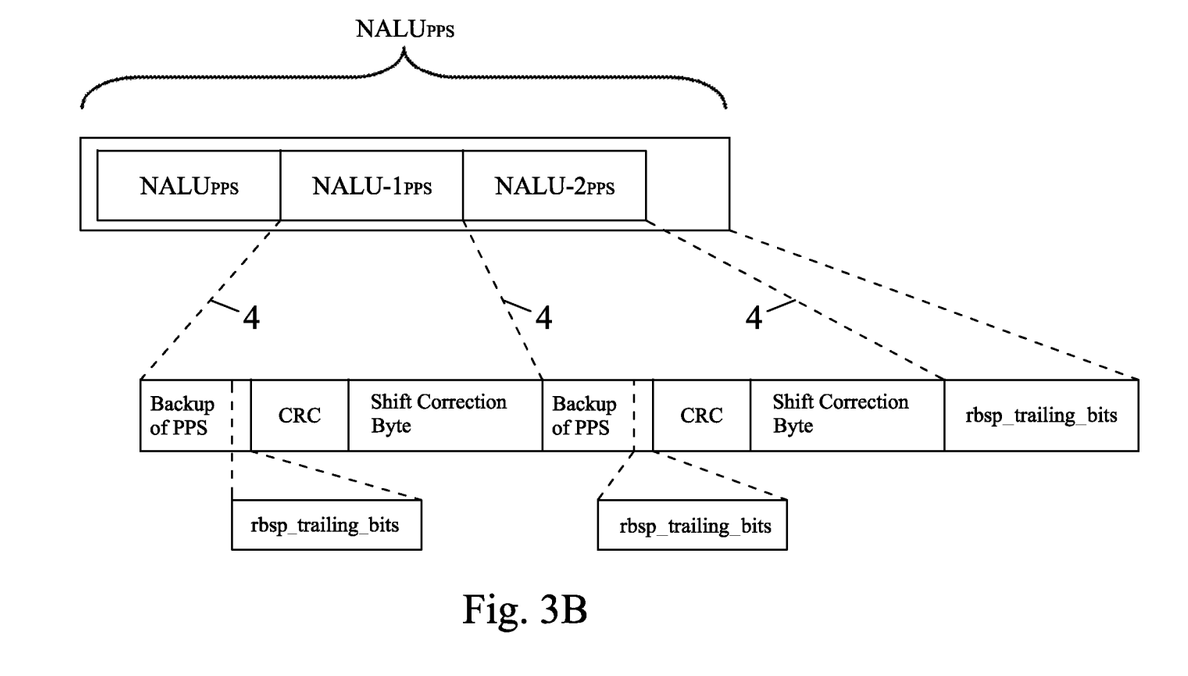
FIG. 3B illustrates backup copies of the PPS inserted inside the original NALU for the PPS.

FIGS. 2B and 3B illustrate the backup format of $NALU_{PPS}$. The backup of $NALU_{PPS}$ is essentially the same as backing up $NALU_{SPS}$, except the copies of PPS instead of SPS are made, and the position for inserting the backup copies are different. For example, referring to FIG. 2B, the backup copy of $NALU_{PPS}$ is inserted at position 12 in FIG. 1, which is right behind the corresponding original $NALU_{PPS}$, and before the $NALU_{SLICE}$. Again, two copies of $NALU_{PPS}$ may be made (denoted as NALU-1$_{PPS}$ and NALU-2$_{PPS}$), wherein each of the NALU-1$_{PPS}$ and NALU-2$_{PPS}$ includes rbsp_trailing bits, a CRC data and a shift correction byte (1000_0001). In a bit-stream, there may be multiple $NALU_{PPS}$. Accordingly, each $NALU_{PPS}$ may be backed up. FIG. 3B illustrates backing up the PPS inside the original $NALU_{PPS}$, which is similar to FIG. 3A. The details are essentially the same as in FIG. 3A, and hence are not repeated herein.

Figure 4:
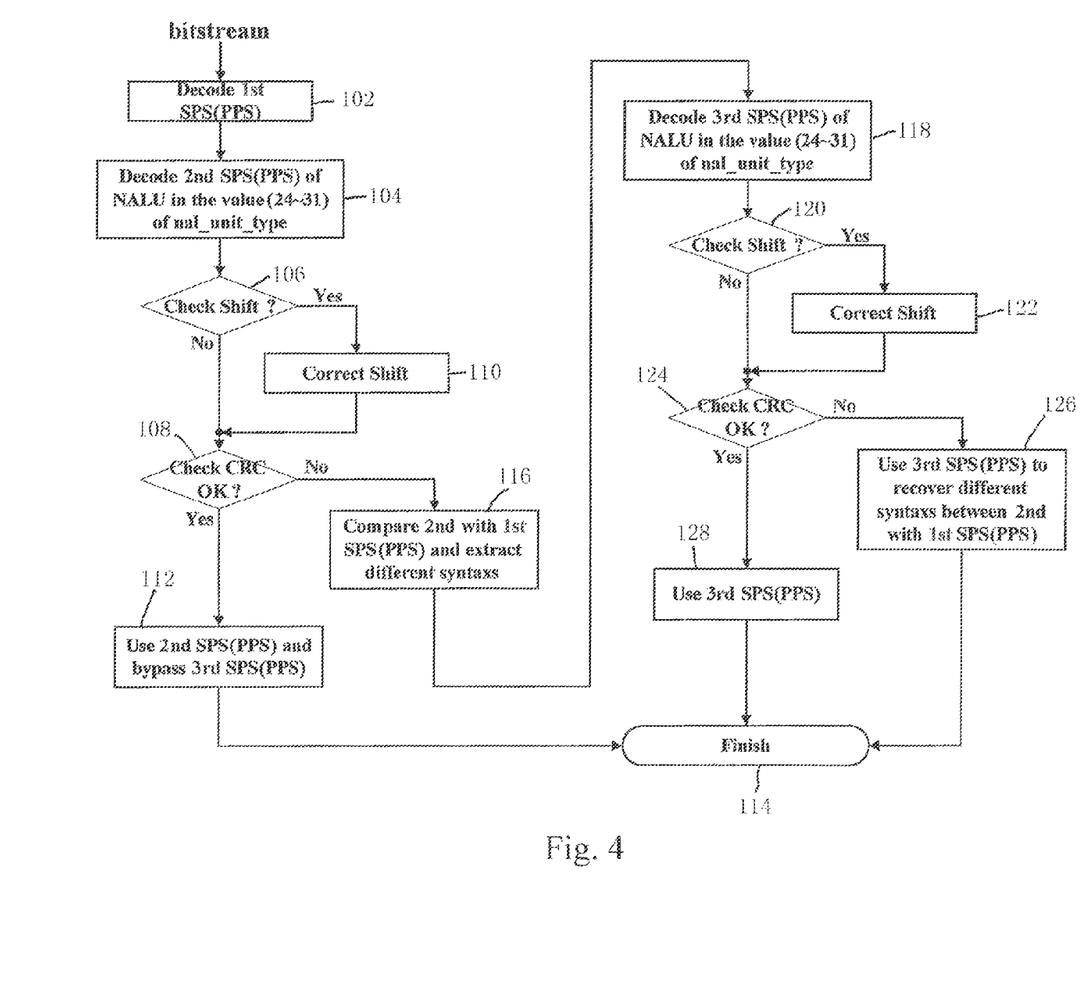
FIG. 4 illustrates a flow chart for decoding a bit-stream having the format shown in FIG. 2A or 2B, wherein a cross-examination is performed to extract correct values of syntaxes in the SPS and the PPS.

FIG. 4 illustrates a flow chart for detecting and correcting the errors in the encoded bit-stream, wherein the flow chart corresponds to FIG. 2A or 2B, in which the backup $NALU_{SPS}$ or $NALU_{PPS}$ are inserted after the corresponding original $NALU_{SPS}$ or $NALU_{PPS}$. For simplicity, the flow charts regarding SPS and PPS are combined into a single flow chart, although in a real situation, the flow charts for SPS and for PPS are separated flows. Accordingly, when reading the flow chart as shown in FIG. 4, either the PPS may be ignored so that the flow chart becomes the flow chart of SPS, or SPS may be ignored so that the flow chart becomes the flow chart of PPS. A brief flow is discussed as follows. The following discussion uses the error detection for SPS and the recovery as an example. However, the same method and flow also apply to the error detection and the recovery of PPS.

Referring to FIG. 4, after a bit-stream is received, a decoder (not shown) decodes the first SPS (the original SPS, step 102) from the (first) $NALU_{SPS}$. The backup copy NALU-1$_{SPS}$ (the second $NALU_{SPS}$), which may be identified by its NALU_type_id in the range of 24 to 31, is then decoded (step 104). The corresponding CRC data and the shift correction byte are hence obtained. The decoder checks whether the shift correction byte is 1000_0001 (or any other predefined value, step 106). If the value is 1000_0001, then the decoder knows that no bit shift occurs, and no bit is lost and no bit is inserted in the corresponding backup copy of SPS and the CRC data. If, however, the shift correction byte is different from the expected value, it is determined that a bit shift occurs, and the decoder will shift the backup copy of SPS and the CRC data to the left or right, until the shift correction byte is restored to 1000_0001 (step 110). For example, if x100_000 is found, the decoder will shift the backup copy of SPS and the CRC data to the left by one bit. If, however, 0000_001x is found, the decoder will shift the backup copy of SPS and the CRC data to the right by one bit. Through this step, the correct (un-shifted) backup SPS (referred to as a first backup SPS hereinafter) and the CRC data in NALU-$1_{SPS}$ are extracted.

Next, a CRC is performed using the extracted CRC data (step 108). If no error occurs, it is determined that the first backup SPS is correct, and this copy is used as the final SPS (step 112) of the entire bit-stream, and the extraction of SPS is finished (step 114). The original SPS may be discarded. However, if the CRC check fails, it means that at least one syntax in the first backup SPS has an error. Therefore, each of the syntaxes in the original SPS and the corresponding syntaxes in the first backup SPS are compared to each other (step 116). Those syntaxes having the same values in the original SPS and in the first backup SPS are determined as having no errors, and those syntaxes having different values in the original SPS and in the first backup SPS are determined as having errors. The syntaxes having errors need to be compared with the values in the backup copy of SPS in NALU-$2_{SPS}$.

In steps 118, 120, 122, and 124, NALU-$2_{SPS}$ is decoded, and the un-shifted CRC and SPS are extracted, followed by a CRC check. The details are essentially the same as in steps 104, 106, 108, and 110, and hence are not repeated herein. Next, a CRC check is performed using the extracted CRC data from NALU-$2_{SPS}$. If no error occurs, it is determined that the backup copy of SPS (referred to as a second backup SPS hereinafter) from NALU-$2_{SPS}$ is correct, and this copy is used as the final SPS (step 128), and the extraction of SPS is finished (step 114). The original SPS and the first backup SPS may be discarded. However, if the CRC fails, it is known that at least one syntax in the second backup SPS has an error. Therefore, each of the syntaxes having errors (previously determined by step 116) is cross-examined with the corresponding syntax in the original SPS, the first backup SPS, and the second backup SPS (step 126). Those syntaxes having the same values in at least two of the original SPS, the first backup SPS, and the second backup SPS are determined as having no errors, and those syntaxes having different values in all of the three copies of SPS are determined as having errors. For a syntax having three different values in three copies of SPS, if only one value is in the defined value range, then this value is determined to be the correct value. If however, none of the three values are in the defined value range, then the value in the SPS of the preceding bit-stream is used.

The extraction of PPS is essentially the same as the above-discussed flow, as also shown in FIG. 4. One difference is that if none of the three different values of a syntax are in the defined value range, then the value in the previous PPS may be used, wherein the previous PPS may be in a same bit-stream, or in a preceding bit-stream.

Figure 5:
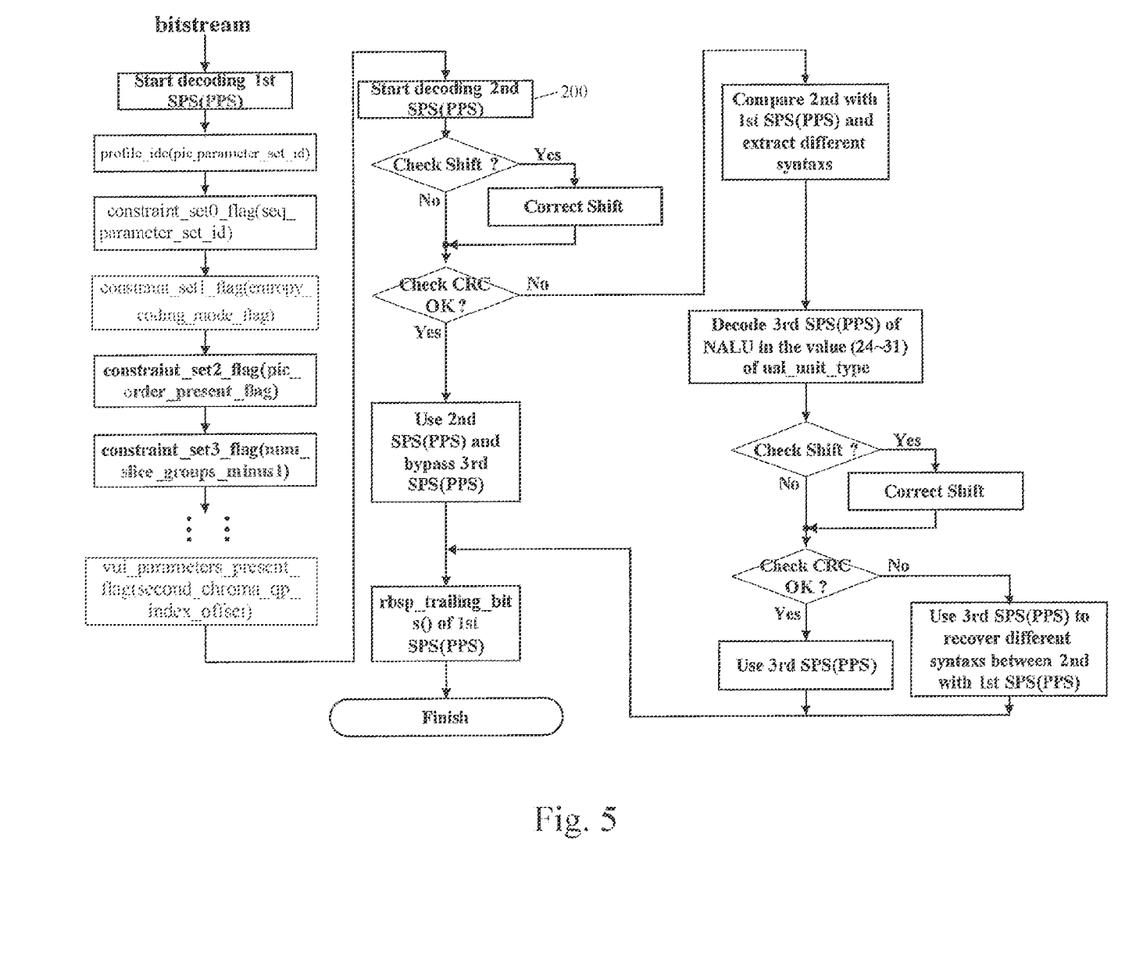
FIG. 5 illustrates a flow chart for decoding a bit-stream having the format shown in FIG. 3A or 3B, wherein a cross-examination is performed to extract correct values of syntaxes in SPS and PPS.

FIG. 5 illustrates a flow chart for detecting and correcting the errors in the encoded bit-stream, wherein the flow chart corresponds to FIG. 3A or 3B, in which the backups of SPS or PPS are inside the corresponding NALU$_{SPS}$ or NALU$_{PPS}$, and after the corresponding original SPS or PPS. Please note that steps including step 200 and the steps after step 200 are similar to the corresponding steps as in FIG. 4 except the backup SPS or PPS are now decoded from the same NALU as the original SPS or PPS. Step 200 may be started after syntax vui_parameters_present_flag or second_chroma_qp_index_offset is decoded. Again, in the flow chart as shown in FIG. 5, if any of the first backup SPS (or PPS) and the second backup SPS (or PPS) passes the CRC check, it has the correct value and is used. Otherwise, the original SPS (or PPS), the first backup SPS (or PPS), and the second backup SPS (or PPS) are cross-examined to determine the correct values of the syntaxes, wherein the cross-examination is similar to the method shown in FIG. 4.

Figure 6:
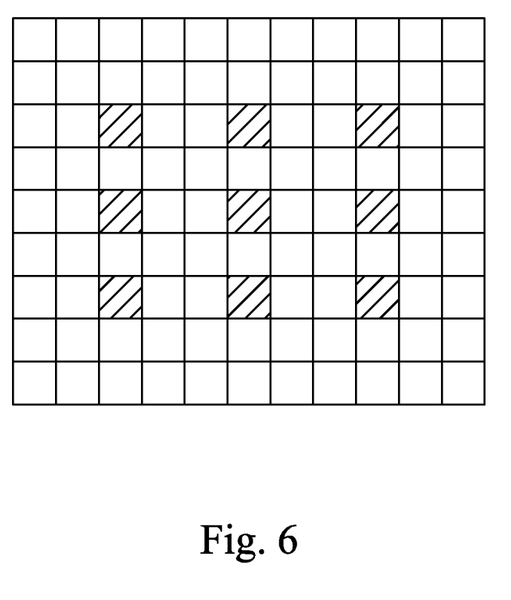
FIGS. 6 and 7 schematically illustrate image frames, and macro block (MB) data that may be backed up.
Figure 7:
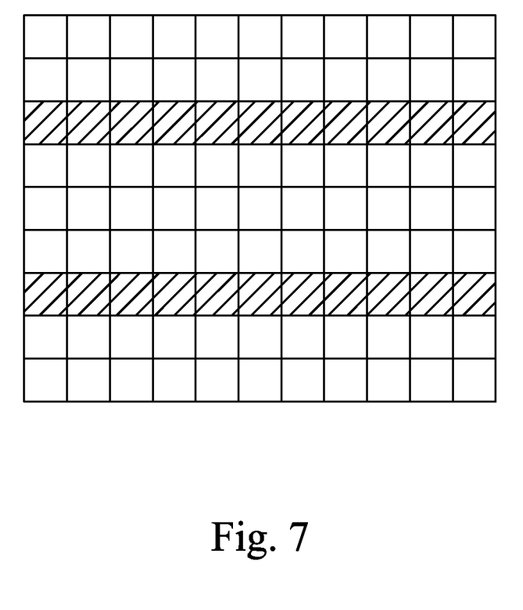

Besides backing up SPS and/or PPS, the embodiments of the present invention also provide mechanisms for backing up important MB_info and MB_data for MBs. FIG. 6 illustrates an exemplary image frame, which includes, for example, 99 (11×9) MBs. It is assumed that the MBs close to the center of the image frame are more important than the MBs close to the edges of the image frame. Further, since the frames are scanned from left to right, and from top to bottom, the MBs above the center of the image frame are more important than the MBs below the center of the frame. Therefore, the assumed important MBs may be selected by taking account of these preferences. For example, in FIG. 6, nine shaded MBs are backed up. Alternatively, as shown in FIG. 7, two rows of shaded MBs are backed up. Please note that the row above the center may be more important since backing up these MBs may prevent the errors in these MBs from being propagated to the rest of MBs in the image frame, including the center MBs of the image frame.

Figure 8:
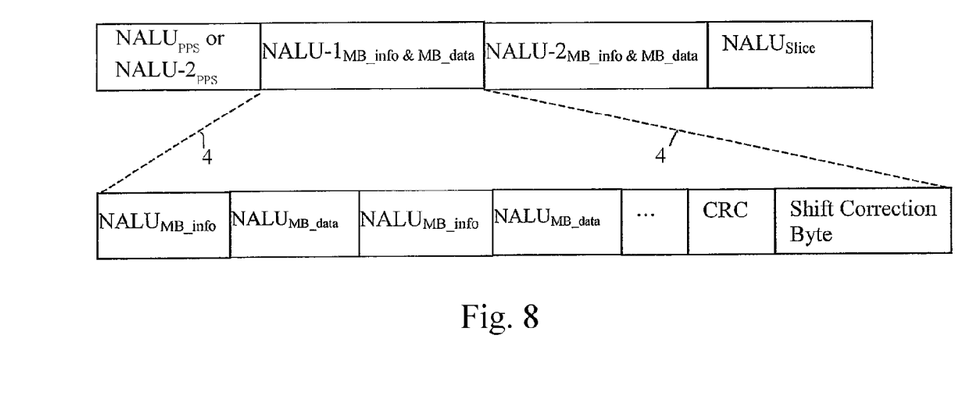
FIG. 8 illustrates backup NALUs comprising backup copies of MB-related data, wherein the backup NALUs are inserted after the original NALU for a respective PPS.

Referring back to FIG. 1, in an embodiment, the backup copies of the MBs may be inserted to position 12. It is appreciated that the original data of the backup copies of MB_info and MB_data are saved in MB$_{slice}$. If the PPS is also backed up and inserted to positions 12 also, the backup copies of the MBs may be inserted after the backup copies of the PPS. FIG. 8 illustrates an exemplary format of the backups NALU-$1_{MB\_info\ \&\ MB\_data}$ and NALU-$2_{MB\_info\ \&\ MB\_data}$, each including a copy of NALU$_{MB\_Info}$ and a copy of NALU$_{MB\_data}$. NALU-$1_{MB\_info\ \&\ MB\_data}$ and NALU-$2_{MB\_info\ \&\ MB\_data}$ have a similar format as NALU-$1_{SPS}$, except all SPS data should be replaced by MB-related MB_info and MB_data. The backup NALU-$1_{MB\_info\ \&\ MB\_data}$ may be treated as replacing the copy of SPS in FIG. 3A with the copy of one or more NALU$_{MB\_info}$ & NALU$_{MB\_data}$, wherein each combined set of NALU$_{MB\_info}$ & NALU$_{MB\_data}$ corresponds to one shaded MB block in FIG. 6 or 7. Again, a CRC data and a shift correction byte (1000_0001) are inserted in each of NALU-$1_{MB\_info\ \&\ MB\_data}$. After the NALU-$1_{MB\_info\ \&\ MB\_data}$ and before the NALU$_{slice}$, there may exist NALU-$2_{MB\_info\ \&\ MB\_data}$, which includes the same information as in NALU-$1_{MB\_info\ \&\ MB\_data}$.

Figure 9:
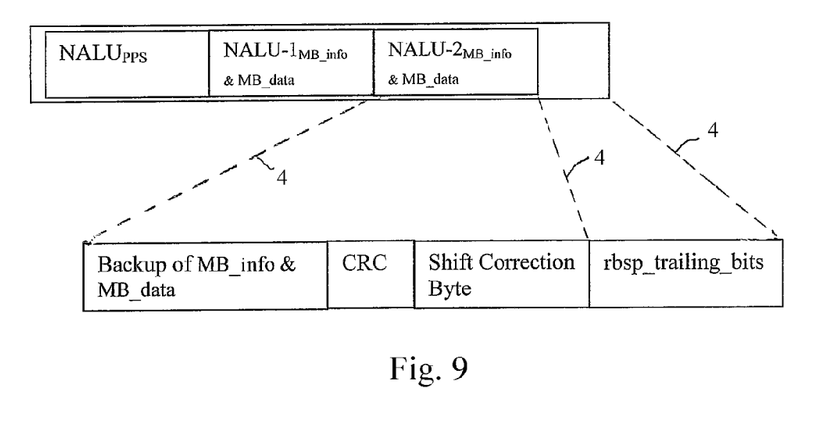
FIG. 9 illustrates backup NALUs comprising backup copies of MB related data inserted inside the original NALU for a respective PPS.

FIG. 9 illustrates an alternative embodiment of the present invention. Instead of inserting the backup copies of MB_info and MB_data to position 12 (refer to FIG. 1), the MB_info and MB_data are inserted to position 9. In this embodiment, the backup copies of MB_info and MB_data are inserted after the original PPS (or the backup copies of PPS), and before the rbsp_trailing_bits. Again, each backup copy of MB_info and MB_data includes CRC data, and a shift correction byte (1000_0001). Similarly, there may be one or more combinations of MB_info and MB_data, wherein each combination of MB_info and MB_data corresponds to one shaded MB block in FIG. 6 or 7.

Figure 10A:
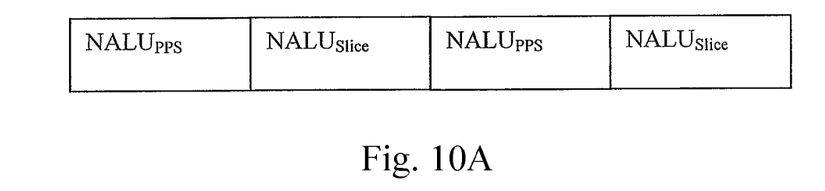
FIGS. 10A and 10B illustrate two formats related to PPSs and slices.
Figure 10B:
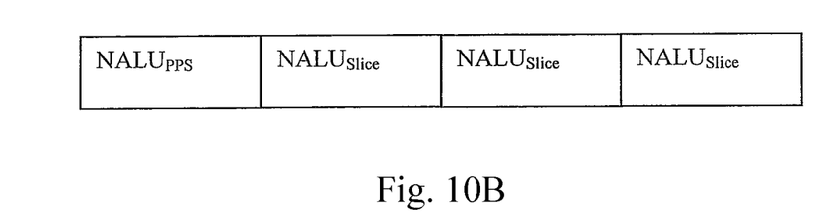

Please note that the embodiments shown in FIGS. 8 and 9 may both apply to the bitstream format as shown in FIG. 10A, wherein each NALU$_{slice}$ is preceded by a NALU$_{PPS}$. In this embodiment, the important MB_info and MB_data in the NALU$_{Slice}$ are backed up before the NALU$_{Slice}$, either after or inside the corresponding NALU$_{PPS}$ that precedes the NALU$_{Slice}$. However, if the bit-stream has the format as shown in FIG. 10B, wherein more than one NALU$_{Slice}$ corresponds to one NALU$_{PPS}$, the embodiment in FIG. 8 may be used, while the embodiment as shown in FIG. 9 may not apply.

Figure 11:
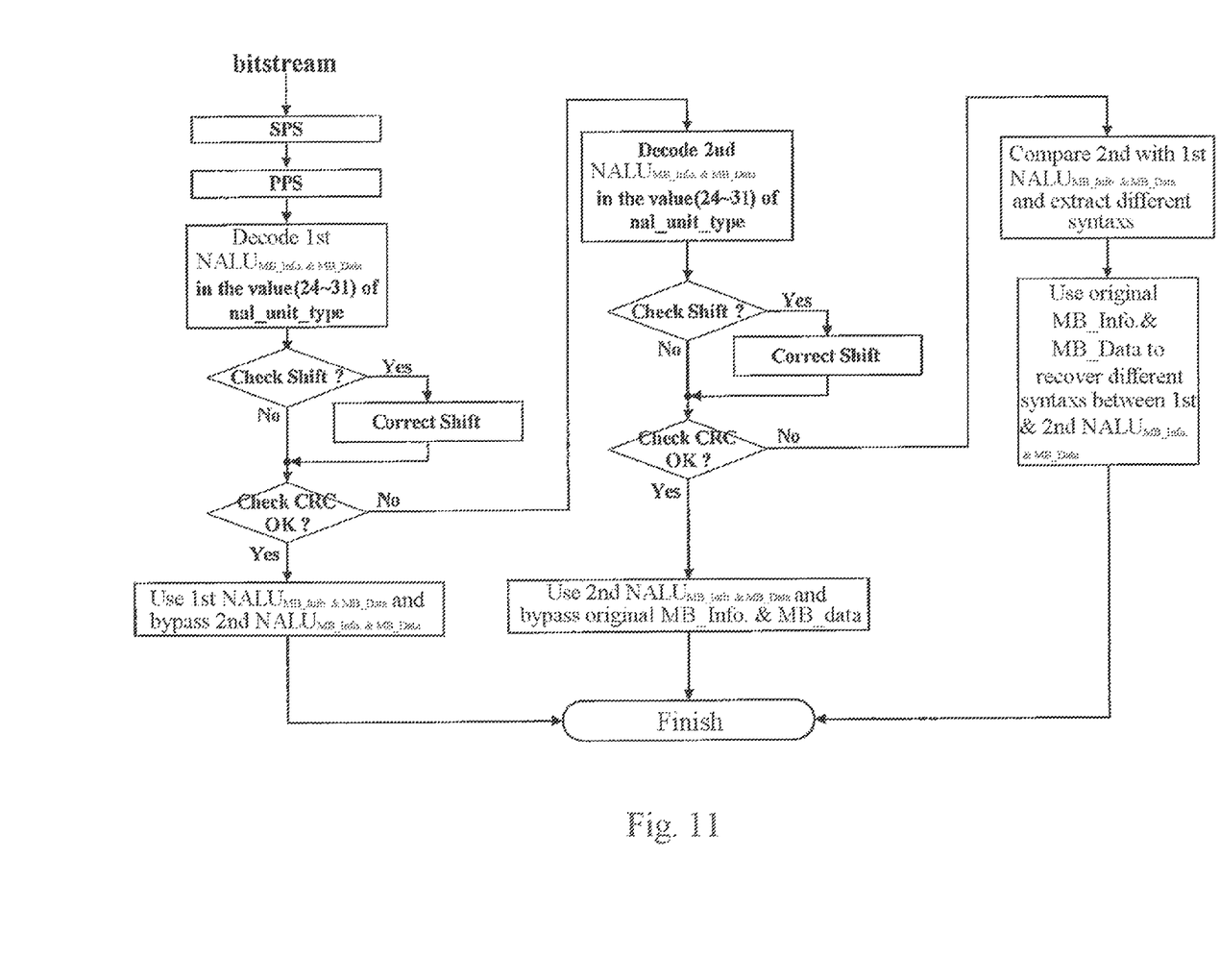
FIG. 11 illustrates a flow chart for decoding a bit-stream having the format shown in FIG. 8, wherein a cross-examination is performed to extract correct values of syntaxes in MBs.

FIG. 11 illustrates a flow chart for detecting and correcting the errors in MB_info and MB_data for MBs, wherein the flow chart corresponds to FIG. 8, in which backups NALU-1$_{MB\_info\ \&\ MB\_data}$ and NALU-2$_{MB\_info\ \&\ MB\_data}$ are inserted after the corresponding original NALU$_{PPS}$ or backup NALU-1$_{PPS}$ or NALU-2$_{PPS}$. The steps are essentially the same as the steps shown in FIG. 4, except MB_info & MB_data (instead of SPS or PPS) are decoded and the correct values of syntaxes therein are extracted. One skilled in the art will realize the details by comparing FIGS. 4 and 11, and by applying the discussions of FIG. 4 to FIG. 11.

Figure 12:
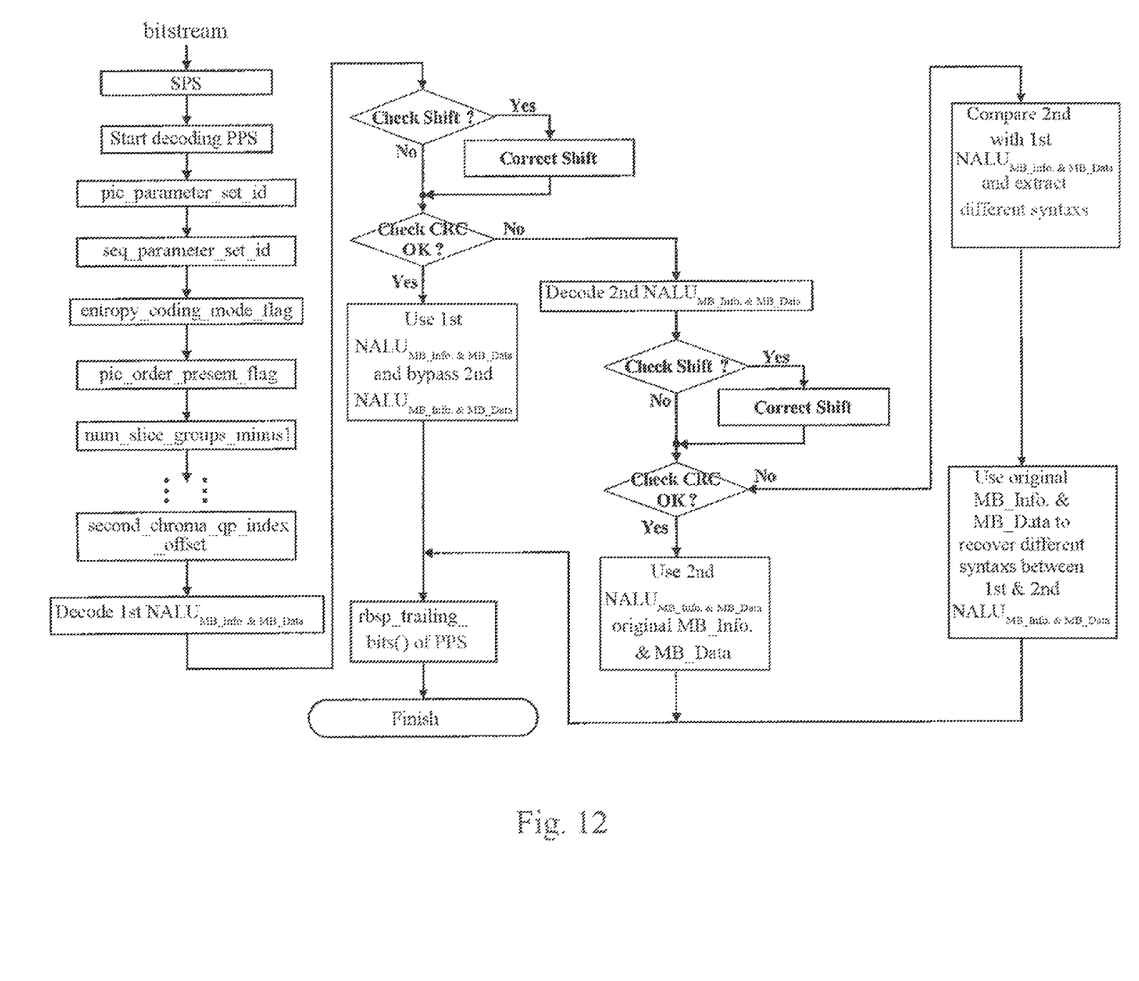
FIG. 12 illustrates a flow chart for decoding a bit-stream having the format shown in FIG. 9, wherein a cross-examination is performed to extract correct values of syntaxes in MBs.

FIG. 12 illustrates a flow chart for detecting and correcting the errors in MB_info and MB_data for MBs, wherein the flow chart corresponds to FIG. 9, in which backup copies of MB_info and MB_data are inside the corresponding preceding NALU$_{PPS}$. The steps are essentially the same as the steps shown in FIG. 5, except one or more combination of MB_info and MB_data (instead of SPS or PPS) are decoded and corrected. One skilled in the art will realize the details by comparing FIGS. 5 and 12, and by applying the discussions of FIG. 5 to FIG. 12.

The embodiments of the present invention have several advantageous features. By backing up SPS, PPS, and/or MB_info and MB_data, the parameters/syntaxes that are important for correctly decoding the bit-stream suffer less from errors. By making two backup copies so that the parameters/syntaxes can be determined through cross-examination, the likelihood of having errors is significantly reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of processing video data, the method comprising:
   providing a bit-stream; and
   decoding the bit-stream comprising:
      extracting a data portion from the bit-stream;
      extracting a first backup copy of the data portion from the bit-stream, wherein the extracting the first backup copy of the data portion from the bit-stream comprises:
         shifting a shift correction byte in the bit-stream until the shift correction byte is identical to a pre-determined reference shift correction byte; and
         shifting the first backup copy of the data portion in a same shift direction and by a same number of bits as the shift correction byte is shifted;
      determining correct values of syntaxes in the data portion from the data portion itself and the first backup copy of the data portion, wherein the step of extracting the first backup copy of the data portion from the bit-stream comprises performing a circular redundancy check (CRC) to determine a correctness of the first backup copy of the data portion;
      retaining all bit values in the first backup copy of the data portion when the CRC passes; and
      cross-examining bit values in the data portion and in the first backup copy of the data portion when the CRC fails, wherein the cross-examining comprises comparing the bit values in the data portion and the bit values in the first backup copy of the data portion bit-by-bit, and adopting identical bit values, and wherein the identical bit values in the data portion and in the first backup copy of the data portion are corresponding bit values that are identical to each other.

2. The method of claim 1, wherein the bit-stream is an H.264 bit-stream, and wherein the data portion is selected from the group consisting essentially of a seq_parameter_set (SPS), a pic_parameter_set (PPS), a macro block (MB) information (MB_info), an MB_data, and combinations thereof.

3. The method of claim 2, wherein the data portion comprises rbsp_trailing_bits.

4. The method of claim 2, wherein the data portion comprises the SPS.

5. The method of claim 2, wherein the data portion comprises the PPS.

6. The method of claim 2, wherein the data portion comprises the MB_info and the MB_data.

7. The method of claim 6, wherein the MB_info and MB_data comprise data of a MB close to a center of an image frame.

8. The method of claim 1 further comprising:
   extracting a second backup copy of the data portion from the bit-stream; and
   cross-examining and determining correct bit values from the data portion, the first backup copy of the data portion, and the second backup copy of the data portion, wherein the correct bit values are identical in at least two of the data portion, the first backup copy of the data portion, and the second backup copy of the data portion.

9. A method of processing video data, the method comprising:
   providing an H.264 bit-stream; and
   decoding the H.264 bit-stream comprising:
      extracting a data portion from the H.264 bit-stream, wherein the data portion is selected from the group consisting essentially of a seq_parameter_set (SPS), a pic_parameter_set (PPS), a macro block (MB) information (MB_info), an MB_data, and combinations thereof;

extracting a first backup copy of the data portion from the H.264 bit-stream, wherein the step of extracting the first backup copy of the date portion comprises:
  shifting a shift correction byte in the H.264 bit-stream until the shift correction byte is identical to a predetermined reference shift correction byte; and
  shifting the first backup copy of the data portion in a same shift direction and by a same number of bits as the shift correction byte is shifted;
performing a first circular redundancy check (CRC) to determine a correctness of the first backup copy of the data portion;
determining correct bit values in the data portion from the data portion itself and the first backup copy of the data portion; and
cross-examining bit values in the data portion and in the first backup copy of the data portion when the CRC fails, wherein the cross-examining comprises comparing the bit values in the data portion and the bit values in the first backup copy of the data portion bit-by-bit, and adopting identical bit values, and wherein the identical bit values in the data portion and in the first backup copy of the data portion are corresponding bit values that are identical to each other.

10. The method of claim 9 further comprising:
extracting a second backup copy of the data portion from the H.264 bit-stream, wherein the step of extracting the second backup copy of the date portion comprises:
  shifting the second backup copy of the data portion in a same shift direction and by a same number of bits as the shift correction byte is shifted; and
performing a second CRC to determine a correctness of the second backup copy of the data portion; and.

11. The method of claim 9, wherein the first backup copy of the data portion is extracted from a network abstraction layer unit (NALU) behind an additional NALU comprising the data portion.

12. The method of claim 9, wherein the first backup copy of the data portion is extracted from a position inside an NALU comprising the data portion.

13. A method of processing video data, the method comprising:
encoding an H.264 bit-stream comprising:
  encoding a data portion into the H.264 bit-stream, wherein the data portion is selected from the group consisting essentially of a seq_parameter_set (SPS), a pic_parameter_set (PPS), a macro block (MB) information (MB_info), an MB_data, and combinations thereof;
  encoding a first backup copy of the data portion into the H.264 bit-stream;
  encoding a circular redundancy check (CRC) data and a shift correction byte into the H.264 bit-stream and following the first backup copy of the data portion; and
  encoding a second backup copy of the data portion into the H.264 bit-stream;
decoding the data portion from the H.264 bit-stream;
decoding the first backup copy of the data portion from the H.264 bit-stream;
decoding the second backup copy of the data portion from the H.264 bit-stream; and
cross-examining bit values in the data portion, the first backup copy of the data portion, and the second backup copy of the data portion to determine correct bit values, wherein bit values that are identical in at least two of data portion, the first backup copy of the data portion, and the second backup copy of the data portion are adopted, and wherein bit values that are different in all three of the data portion, the first backup copy of the data portion, and the second backup copy of the data portion are performed with further determination.

14. The method of claim 13, wherein the first backup copy of the data portion is encoded to a position behind a network abstraction layer unit (NALU) comprising the data portion.

15. The method of claim 13, wherein the first backup copy of the data portion is encoded to a position inside an NALU comprising the data portion.

\* \* \* \* \*

UNITED STATES PATENT AND TRADEMARK OFFICE
CERTIFICATE OF CORRECTION

| | | |
|---|---|---|
| PATENT NO. | : 8,767,840 B2 | Page 1 of 1 |
| APPLICATION NO. | : 12/617498 | |
| DATED | : July 1, 2014 | |
| INVENTOR(S) | : Chuang | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 936 days.

Signed and Sealed this
Eleventh Day of August, 2015

Michelle K. Lee
*Director of the United States Patent and Trademark Office*